Sept. 16, 1958 A. J. RADCLIFFE, JR 2,852,680

NEGATIVE-IMPEDANCE TRANSISTOR OSCILLATOR

Filed March 28, 1956

United States Patent Office 2,852,680

Patented Sept. 16, 1958

2,852,680

NEGATIVE-IMPEDANCE TRANSISTOR OSCILLATOR

Arthur J. Radcliffe, Jr., La Grange, Ill., assignor to International Telephone and Telegraph Corporation, New York, N. Y., a corporation of Maryland Application March 28, 1956, Serial No. 574,488

7 Claims. (Cl. 250—36)

This invention relates to a negative-impedance transistor oscillator. Its principal object is to provide a transistor oscillator which has enhanced stability both as to frequency and to the amplitude of its oscillations.

Another object is to provide an oscillator which may be tuned over a wide frequency range without substantial variation of amplitude.

In oscillators which use a feed-back amplifier and a tuned circuit, it is known that the frequency and amplitude depend to a considerable extent upon the characteristics of the feed-back amplifier, in that the frequency or the amplitude, or both, are liable to change incident to a change in the amplifier characteristics. Transistor oscillators present much greater stability problems than vacuum tube oscillators because (1) since the transistor is a current operated device, the tuned circuit is shunted by an additional resistive element, the input resistance; and (2) transistor characteristics vary much more with temperature and from one transistor to another than the analogous vacuum tube characteristics.

Therefore a transistor oscillator using a parallel tuned circuit to determine the frequency does not have stability comparable to that of the better vacuum-tube oscillators.

Investigation of transistors have shown that those with a current-gain factor, alpha, of less than unity (such as the junction type) are more stable than those with a current gain factor greater than unity (such as the point-contact type).

Use of a grounded-base amplifier would help achieve temperature stability, but the transformer required with junction transistors introduces other stability problems and makes the circuit more complex. The grounded-emitter amplifier has sufficient current gain to be used without a transformer, but has disadvantages, such as poor amplitude stability.

According to the invention, the difficulties in obtaining stability in a transistor oscillator are overcome by using a negative-impedance converter, with a series-tuned circuit to determine the frequency connected across the short-circuit unstable terminals, and a relatively low impedance connected across the open-circuit unstable terminals.

In the preferred form of the invention, the converter is of the type using two transistors, with the collector of each connected to the base of the other, the short-circuit unstable terminals being the emitter terminals, and the open-circuit unstable terminals being the collector-terminals. This circuit has push-pull characteristics, which improve both temperature and amplitude stability. A PNP and a NPN transistor are used, permitting direct coupling and a simple bias circuit, and thereby saving several condensers and resistors.

The impedance across the open-circuit unstable terminals may be (1) a resistor, (2) a pair of parallel oppositely directed diodes to limit, and thereby stabilize, the amplitude of oscillation, (3) a pair of oppositely directed diodes in series, using the region of constant inverse voltage (Zener) for limiting, or (4) a parallel tuned circuit, tapped down on the inductor.

The foregoing and other objects and features of this invention and the manner of attaining them will become more apparent and the invention itself will be best understood, by reference to the following description of an embodiment of the invention taken in conjunction with the accompanying drawings comprising Figs. 1 to 4, wherein.

DETAILED DESCRIPTION

Figure 1:
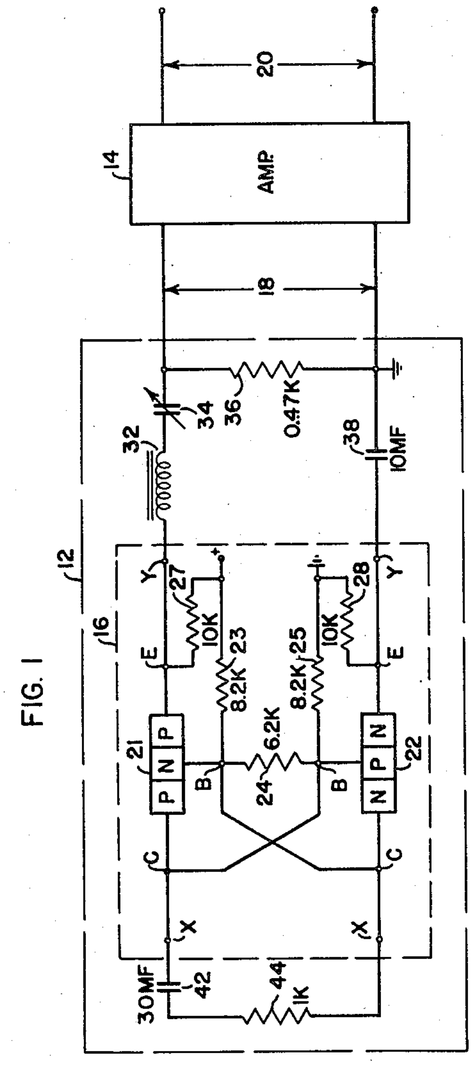
Fig. 1 shows the oscillator circuit in detail.

Referring to Fig. 1, an oscillator 12 is shown with its output on line 18 connected through an amplifier 14 to line 20. The oscillator 12 comprises an amplifier 16, which is known as a negative impedance converter, an impedance connected between terminals X—X, and an impedance including a series tuned circuit connected between terminals Y—Y.

The converter 16 is of the type disclosed in my application, Serial No. 549,760, filed November 29, 1955, for a Negative-Impedance Repeater Using a Transistor Amplifier. A negative-impedance converter is a four-terminal device comprising an amplifier with a regenerative feedback arrangement such that, within a frequency range, an impedance between the terminals of one pair appears as a corresponding negative impedance to a circuit between the terminals of the other pair. Generally the signal current and voltage are approximately equal in absolute value in the two circuits, when measured between the terminals of the respective pairs, but the converter delivers signal power to one circuit corresponding to the signal loss in the other circuit. Across one pair of terminals, X—X, the amplifier is unstable if open-circuited, and stable if short-circuited. Across the other pair of terminals, Y—Y, the amplifier is unstable if short-circuited, and stable if open-circuited.

Converter 16 comprises a PNP transistor 21 and an NPN transistor 22. These are junction transistors with complementary characteristics. Feedback is obtained by connecting the collector terminal of each transistor to the base terminal of the other.

The bias circuit includes a resistance network with a resistor 23 connected between the positive terminal of a power supply to the base terminal of transistor 21, a resistor 24 between the base terminals of the two transistors, and a resistor 25 from the base terminal of transistor 22 to ground. A resistor 27 is connected from the positive terminal to the emitter terminal of transistor 21, and a resistor 28 is connected from ground to the emitter terminal of transistor 22.

The open-circuit stable, short-circuit unstable terminals Y—Y of the amplifier are the respective emitter terminals of the transistors; and the short-circuit stable, open-circuit unstable terminals X—X are the respective collector terminals.

The amplifier may be made to oscillate at a controlled frequency by connecting a series tuned circuit, which has a low impedance at the resonant frequency, between the terminals Y—Y; or by connecting a parallel resonant circuit, which has a high impedance at the resonant frequency, between the terminals X—X. In each case an appropriate impedance should be connected across the other pair of terminals to control the positive feedback and establish a condition of stable oscillation. The use of a parallel resonant circuit between the terminals X—X to determine the frequency is unsatisfactory because of the undesirable effects of the amplifier impedance between these terminals, and also because of the effects from the variations of transistor characteristics. And, more important, for a variable frequency oscillator, the impedance of the parallel resonant circuit changes with frequency, disturbing the conditions required for stable oscillation. These disadvantages may be overcome by using a series tuned circuit between the terminals Y—Y.

In the oscillator 12, a series resonant circuit comprising an inductor 32 and a condenser 34 is connected to one terminal Y. A resistor 36 is connected in series with the resonant circuit to ground to raise the effective load impedance. The other terminal Y is connected through a condenser 38 to ground.

The output line 18 to amplifier 14 is connected across the resistor 36. The input impedance of amplifier 14 should be high compared to the resistance of resistor 36. Since the current through resistor 36 flows through a series resonant circuit, the voltage drop across the resistor and the input of amplifier 14 has a good sinusoidal form.

The impedance across resistor 36 and line 18 is large compared to the amplifier impedance between the emitter terminals, and therefore the effect of changes in the emitter resistances of transistors 21 and 22 is small.

The impedance across terminals X—X should have a value which compensates for losses in the circuit between the terminals Y—Y. In Fig. 1 this impedance comprises a resistor 44 in series with a blocking condenser 42.

With a series tuned circuit the frequency may be varied over a wide range without substantial change in the amplitude of oscillation because the impedance at resonance is always a close approximation to the D. C. resistance. For example, with a voice-frequency oscillator, the frequency was varied over a two-to-one range by varying condenser 34 over a four-to-one range, and the amplitude remained constant within one db.

The component elements in Fig. 1 have values shown which were found satisfactory for use with a 22-volt D. C. power supply. A representative frequency of oscillation is 1325 cycles per second, obtained with an inductance of 480 millihenries for coil 32, and a capacitance of about 0.03 microfarads for condenser 34.

Figure 2:
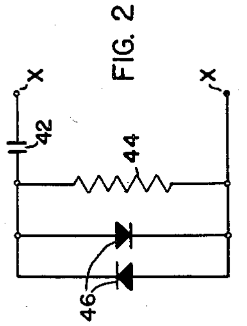
Figs. 2 to 4 show alternative forms of the impedance across the open-circuit unstable terminals.

*Fig. 2*

Fig. 2 shows an alternative form of the impedance connected across the short circuit stable terminals X—X. A pair of silicon junction diodes 46 are connected reversely in parallel and shunted across resistor 44. The forward conduction characteristics limit the peak voltage to a definite value. The amplitude of oscillation is thereby stabilized effectively.

Figure 3:
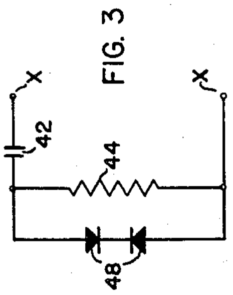

*Fig. 3*

In Fig. 3, a pair of silicon junction diodes 48 are shown connected in series opposition and shunted across resistor 44. The peak voltage is limited by the inverse breakdown (Zener) voltage, which has better temperature stability than the forward characteristic.

Figure 4:
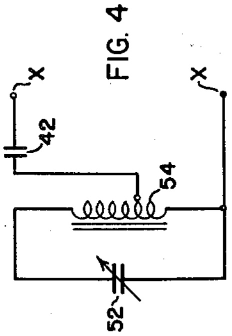

*Fig. 4*

Fig. 4 shows a parallel resonant circuit comprising condenser 52 and inductor 54 as the impedance across the terminals X—X. The connection is made through blocking condenser 42 to a tapped down point of the inductor 54, to obtain the required impedance value. By thus using a circuit between the terminals X—X which has maximum impedance at the desired frequency, the stability may be improved, while retaining the benefits of a series tuned circuit between terminals Y—Y.

While I have described above the principles of my invention in connection with specific apparatus, it is to be clearly understood that this description is made only by way of example and not as a limitation to the scope of my invention.

I claim:

1. An oscillator comprising a negative-impedance converter having a first and a second pair of terminals, together with amplifying and regenerative feedback means interconnected among the terminals for generating and delivering signal power to circuits connected as load elements between the terminals of the respective pairs, the signal power delivered to the circuit between the terminals of either pair corresponding to the signal power consumed in the circuit between the terminals of the other pair, the converter being unstable if the first pair of terminals is short circuited, or the second pair is open circuited, and being stable if the first pair of terminals is open circuited or the second pair is short circuited, a first impedance including a series-resonant circuit connected as the said load element between the terminals of said first pair, and a second impedance connected as the said load element between the terminals of said second pair, for producing oscillation at the frequency determined by said series-resonant circuit.

2. An oscillator according to claim 1, wherein the said amplifying means comprises a pair of junction transistors having emitter, base, and collector terminals, with direct-current source means for supplying bias currents to the transistors, the said feedback means comprises a connection from the base terminal of each transistor to the collector terminal of the other, and the said first pair of terminals comprises the respective emitter terminals and the said second pair of terminals comprises the respective collector terminals of the transistors.

3. An oscillator according to claim 2, wherein the said first impedance includes a resistor in series with the said series-resonant circuit, the resistor having a value which is high compared to the converter impedance at the said first pair of terminals.

4. In an oscillator according to claim 3, an output circuit path coupled across the said resistor for deriving a sinusoidal wave as determined by the signal current flowing through the said series-resonant circuit.

5. An oscillator according to claim 1, wherein the said second impedance comprises a pair of diodes connected reversely in parallel and shunted across a resistor for limiting the signal voltage to a value determined by the forward conduction characteristics of the diodes.

6. An oscillator according to claim 1, wherein the said second impedance comprises a pair of diodes connected in series opposition, and shunted across a resistor for limiting the signal voltage to a value determined by the inverse breakdown characteristics of the diodes.

7. An oscillator according to claim 1, wherein the said second impedance comprises a parallel-resonant circuit which is tuned and has connections made across a portion thereof to obtain an impedance for producing stable oscillation at the frequency determined by the said series-resonant circuit.

References Cited in the file of this patent

UNITED STATES PATENTS 2,726,370 Linvill et al. ------------ Dec. 6, 1955

OTHER REFERENCES

Article: "A Negative Impedance Telephone Repeater for Field Use"; by La Rosa et al.; pages 242–253, of "Proceedings of a Symposium on the Application . . . Equipment," published September 1953.